(12) United States Patent
Kodama et al.

(10) Patent No.: US 12,409,470 B2
(45) Date of Patent: Sep. 9, 2025

(54) SUBSTRATE PROCESSING APPARATUS AND SUBSTRATE PROCESSING METHOD

(71) Applicant: Tokyo Electron Limited, Tokyo (JP)

(72) Inventors: Teruhiko Kodama, Kumamoto (JP); Koichi Matsunaga, Kumamoto (JP); Hideaki Iwasaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 189 days.

(21) Appl. No.: 18/282,025

(22) PCT Filed: Mar. 1, 2022

(86) PCT No.: PCT/JP2022/008510
§ 371 (c)(1),
(2) Date: Sep. 14, 2023

(87) PCT Pub. No.: WO2022/196336
PCT Pub. Date: Sep. 22, 2022

(65) Prior Publication Data
US 2024/0189856 A1    Jun. 13, 2024

(30) Foreign Application Priority Data
Mar. 15, 2021   (JP) .................................. 2021-041053

(51) Int. Cl.
*B05D 5/08*    (2006.01)
*B05C 9/14*    (2006.01)
(Continued)

(52) U.S. Cl.
CPC ................ *B05C 9/14* (2013.01); *B05C 15/00* (2013.01); *B05D 3/02* (2013.01); *B05D 3/0466* (2013.01)

(58) Field of Classification Search
CPC ...................................................... B05D 5/08
See application file for complete search history.

(56) References Cited

U.S. PATENT DOCUMENTS

2013/0319272 A1* 12/2013 Tanaka ..................... B41K 3/26
101/333
2016/0043007 A1*  2/2016 Fonseca ............ H01L 21/30625
438/16

(Continued)

FOREIGN PATENT DOCUMENTS

JP        2019-121683 A       7/2019

*Primary Examiner* — Cachet I Proctor
(74) *Attorney, Agent, or Firm* — Nath, Goldberg & Meyer; Jerald L. Meyer; Tanya E. Harkins (57) ABSTRACT

A substrate processing apparatus that forms a friction reducing film on a rear surface of a substrate includes a processing container configured to accommodate the substrate and to define a hermetically-sealed processing space, a heating element configured to heat the rear surface of the substrate inside the processing container, a supplier configured to supply a material forming the friction reducing film toward the rear surface of the substrate inside the processing container, a first gas supplier configured to supply an inert gas to a peripheral edge of the substrate from a space above the substrate, a second gas supplier configured to supply the inert gas closer to a center of the substrate than the first gas supplier from a space above the substrate inside the processing, and an exhauster configured to exhaust an atmosphere of the processing space from a periphery or a space below the substrate.

17 Claims, 4 Drawing Sheets

(51) Int. Cl.
  *B05C 15/00* (2006.01)
  *B05D 3/02* (2006.01)
  *B05D 3/04* (2006.01)

(56) References Cited

U.S. PATENT DOCUMENTS

2017/0092504 A1* 3/2017 Kubo ................ H01L 21/02052
2018/0082833 A1* 3/2018 Kang ................ H01L 21/67196
2019/0212653 A1* 7/2019 Kodama ........... H01L 21/68742
2021/0232050 A1* 7/2021 Matsunaga ............... G03F 7/38

* cited by examiner

SUBSTRATE PROCESSING APPARATUS AND SUBSTRATE PROCESSING METHOD

This is a National Phase Application filed under 35 U.S.C. 371 as a national stage of PCT/JP2022/008510, filed Mar. 1, 2022, an application claiming the benefit of Japanese Application No. 2021-041053, filed Mar. 15, 2021, the content of each of which is hereby incorporated by reference in its entirety.

TECHNICAL FIELD

The present disclosure relates to a substrate processing apparatus and a substrate processing method.

BACKGROUND

Patent Document 1 discloses a substrate processing apparatus that applies a coating liquid to a frontal surface of a substrate and develops an exposed coating film on the frontal surface of the substrate, the substrate processing apparatus having a film forming part that forms, before exposure, a friction reducing film on the rear surface of the substrate to reduce friction between the rear surface of the substrate and a holding surface that holds the rear surface of the substrate during exposure.

PRIOR ART DOCUMENT

Patent Document

Patent Document 1: Japanese laid-open publication No. 2019-121683

The technique of the present disclosure prevents a friction reducing film from infiltrating a frontal surface of the substrate when being formed on the rear surface of a substrate.

SUMMARY

According to one embodiment of the present disclosure, there is provided a substrate processing apparatus that forms a friction reducing film on a rear surface of a substrate, the apparatus including a processing container configured to accommodate the substrate therein and to define a hermetically-sealed processing space, a heating element configured to heat the rear surface of the substrate inside the processing container, a supplier configured to supply a precursor that forms the friction reducing film toward the rear surface of the substrate inside the processing container, a first gas supplier configured to supply an inert gas to a peripheral edge of the substrate from a space above the substrate inside the processing container, a second gas supplier configured to supply the inert gas closer to a center of the substrate than the first gas supplier from a space above the substrate inside the processing, and an exhauster configured to exhaust an atmosphere of the processing space from a periphery of the substrate or a space below the substrate inside the processing container.

According to the present disclosure, it is possible to prevent a friction reducing film from infiltrating a frontal surface of the substrate when being formed on the rear surface of a substrate.

DETAILED DESCRIPTION

For example, in the manufacturing process of semiconductor devices having a multilayer wiring structure, a photolithography process of forming a resist pattern on a substrate such as a semiconductor wafer (hereinafter sometimes simply referred to as "wafer") is performed multiple times. In the photolithography process, several steps are carried out, including resist coating for coating the wafer with a resist liquid to form a resist film, exposure for patterning the resist film, and development for developing the exposed resist film. These steps result in the formation of a predetermined resist pattern on the wafer.

Between the respective photolithography processes, exposure is performed such that shots hit the same area of the wafer. Further, with the increasing miniaturization of resist patterns due to a further integration of semiconductor devices in recent years, there is a growing demand for higher positional alignment accuracy, i.e., overlay accuracy between the shot hitting area in the previous photolithography process and the shot hitting area in the subsequent photolithography process.

Therefore, as disclosed in Patent Document 1, it has been proposed to improve overlay by coating the rear surface of the wafer with a friction reducing film, which alleviates attraction deformation caused when the wafer is chucked to a stage of an exposure apparatus.

When coating the rear surface of the wafer with the friction reducing film, the inside of a processing container is exhausted from, for example, the periphery of the wafer accommodated in the processing container and at the same time, a precursor gas or vapor is supplied to the center of the rear surface of the wafer.

In this case, the precursor gas or vapor supplied to the rear surface of the wafer may infiltrate a frontal surface from a peripheral edge of the wafer. In particular, this tendency becomes more pronounced when the distance between the rear surface of the wafer and the precursor gas or vapor is reduced in order to enhance the efficiency of coating. If the precursor of this type of friction reducing film, for example, a fluorine-based resin film, infiltrates the frontal surface from the peripheral edge of the wafer, it may affect the wettability of the coating film (for example, SOC or resist film) on the frontal surface, and may also affect an EBR processing.

Therefore, the technique of the present disclosure prevents a precursor vapor or gas for friction reducing film formation from infiltrating a frontal surface from the peripheral edge of a wafer accommodated in a processing container even if the vapor or the gas is supplied to the rear surface of the wafer while evacuating the inside of the processing container from the periphery or below of the wafer.

Hereinafter, a configuration of a substrate processing apparatus according to the present embodiment will be described with reference to the drawings. In addition, in this specification, elements having substantially the same functional configuration will be denoted by the same reference numerals, and redundant descriptions thereof will be omitted.

Figure 1:
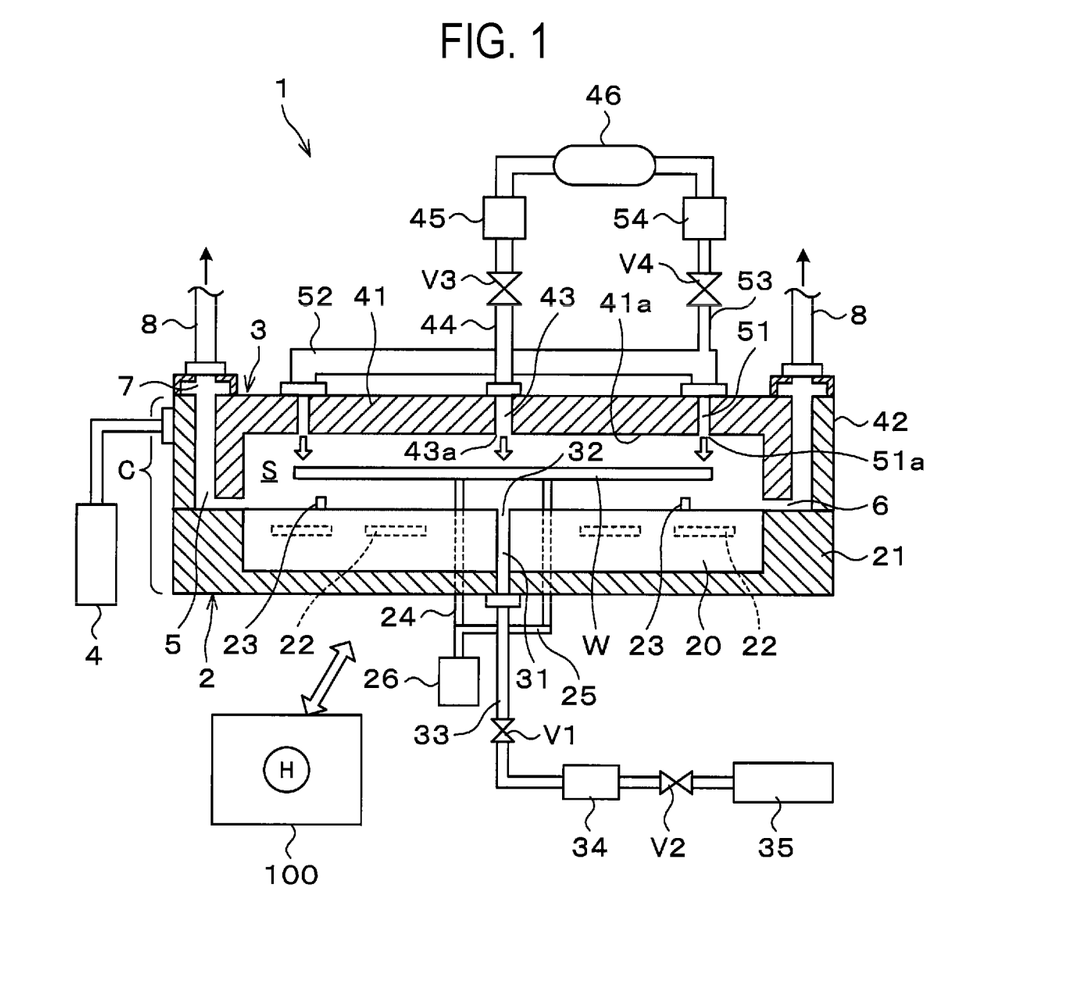
FIG. 1 is a side cross-sectional view schematically illustrating an outline of a configuration of a substrate processing apparatus according to the present embodiment.

FIG. 1 is a side view schematically illustrating an outline of a configuration of a substrate processing apparatus 1 according to the present embodiment. The substrate processing apparatus 1 includes a lower member 2 and an upper member 3 which constitute a processing container C. The lower member 2 includes a disc-shaped heating plate 20 having a radius larger than the radius of a wafer W which is a substrate, and a flat cylindrical outer casing 21 surrounding the heating plate 20 except for an upper surface thereof.

A heater 22, which is formed of a resistance heating element constituting a heating part, is built in the heating plate 20. The heater 22 is, for example, divided into a plurality of segments arranged in concentric circles about the center of the heating plate 20, and thus, is configured to be capable of heating the surface of the heating plate 20 with high uniformity. In addition, for the clarity of illustration, FIG. 1 illustrates the heater 22 as divided into two segments.

A plurality of, for example, eight gap pins 23 are provided on the surface of the heating plate 20 along a circle having a radius shorter than the radius of the wafer W about the center of the heating plate 20. The height of each gap pin 23 is set to, for example, 1 mm from the surface of the heating plate 20. In addition, for the clarity of illustration, FIG. 1 illustrates only two gap pins 23.

Three lifting pins 24 are provided closer to the center of the heating plate 20 than the gap pins 23, to pass through the heating plate 20 in the circumferential direction along a circle centered to the center of the heating plate 20. The three lifting pins 24 are connected to a lifter 26 via a lifting member 25, and the lifter 26 is configured with an air cylinder, for example. In addition, for the clarity of illustration, FIG. 1 illustrates only two lifting pins 24.

A flow path 31, through which a deposition material to be described later, flows, is formed to pass through a central portion of the heating plate 20. The distal end of the flow path 31 forms a discharge port 32 that is open to the central portion of the heating plate 20. That is, the exit of the flow path 31 forms the discharge port 32, constituting a supplier. Further, the proximal end of the flow path 31 passes through a central portion of the outer casing 21 and is connected to a precursor supply pipe 33. The precursor supply pipe 33 is connected to a precursor source 35 via a valve V1, a flow regulator 34, and a valve V2. The precursor source 35 provides, for example, HMDS vapor or mist. The HMDS vapor or mist flows through the precursor supply pipe 33 by a carrier gas such as a nitrogen gas. In addition, the HMDS vapor or mist is generated by vaporizing a HMDS liquid using a vaporizer or by using a known technique such as bubbling, and thus, details thereof are omitted. As a material for a friction reducing film according to the present disclosure, other fluorine-based resin materials including PTFE may be used.

The upper member 3 includes a flat cylindrical lid 41 to cover a space above the lower member 2. A lower surface of a peripheral wall portion 42 of the lid 41 is formed to overlap with an upper surface of the outer casing 21. The lid 41 is configured to be vertically movable, by a lifter 4, between a position where it overlaps with the lower member 2 and a position where the transfer of the wafer W occurs between an external substrate transfer mechanism (not illustrated) and the lifting pins 24. Further, when the outermost lower surface of the peripheral wall portion 42 of the lid 41, i.e., the lower surface outside an exhaust path 5 to be described later comes into close contact with the upper surface of the outer casing 21, a processing space S is defined between the lid 41 and the outer casing 21. An inner top surface of the lid 41 configures a ceiling portion 41a.

A gas flow path 43 is formed to pass through a central portion of the ceiling portion 41a of the lid 41, and is open to the processing space S defined between the lid 41 and the outer casing 21. An upper end of the gas flow path 43 is connected to a purge gas supply pipe 44, and a valve V3, a flow regulator 45, and a purge gas source 46 are connected to the purge gas supply pipe 44 in this order from the downstream side. In this example, an inert gas such as a nitrogen gas is used as a purge gas. The gas flow path 43 configures as a second gas supplier, and a lower end opening of the gas flow path 43 forms a second discharge hole 43a.

A plurality of gas flow paths 51 is provided in the periphery of the ceiling portion 41a of the lid 41 for supplying the purge gas toward the peripheral edge of the wafer W accommodated in the processing container C. The gas flow paths 51 configure a first gas supplier. The gas flow paths 51 are open to the processing space S, and lower end openings thereof form first discharge holes 51a.

Figure 2:
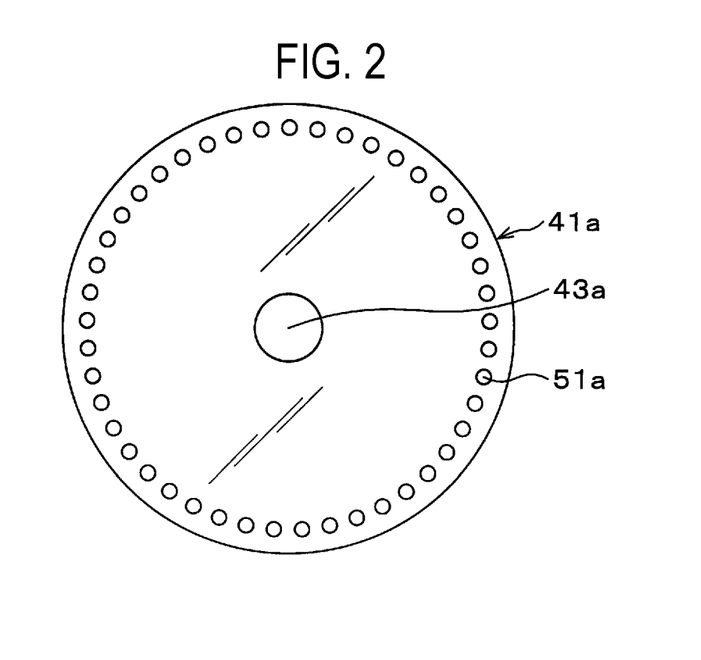
FIG. 2 is an explanatory view of a ceiling portion of the substrate processing apparatus of FIG. 1 as viewed from the bottom side.
Figure 3:
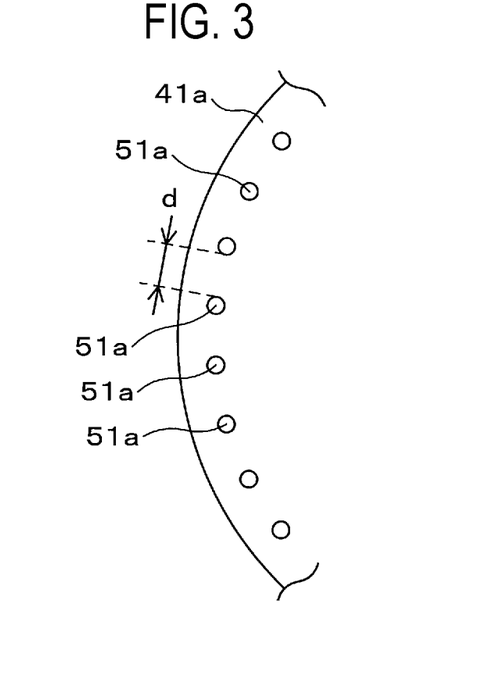
FIG. 3 is a partially enlarged explanatory view of FIG. 2 illustrating a state of first discharge holes formed in the ceiling portion of FIG. 2.

As illustrated in FIG. 2, the first discharge holes 51a are arranged in a circular ring shape at the periphery of the ceiling portion 41a. That is, in the present embodiment, there are 360 first discharge holes 51a provided along the circumferential direction of the wafer W accommodated in the processing container C and placed on the gap pins 23. Further, the diameter of each first discharge hole 51a is set to 3 mm, for example. Furthermore, as illustrated in FIG. 3, the distance d between the neighboring first discharge holes 51a is set to 3 mm, for example.

An upper end of each gas flow path 51 is in communication with a header 52. The header 52 is connected to a purge gas supply pipe 53. The purge gas supply pipe 53 is provided with a valve V4 and a flow regulator 54, and is connected to the purge gas source 46. The header 52 may be built in the lid 41.

As illustrated in FIG. 1, a plurality of vertically extending exhaust paths 5 are arranged along the circumferential direction of the lid 41 inside the peripheral wall portion 42 of the lid 41. The lower surface of the peripheral wall portion 42 outside the exhaust paths 5 comes into close contact with the upper surface of the outer casing 21 as described above, but the lower surface of the peripheral wall portion 42 inside the exhaust paths 5 do not come into close contact with the upper surface of the outer casing 21. In other words, the lower surface of the peripheral wall portion 42 inside the exhaust paths 5 is positioned higher than the lower surface outside the exhaust paths 5. Thus, an annular exhaust port 6 is formed between the lower surface of the peripheral wall portion 42 inside the exhaust paths 5 and the upper surface of the outer casing 21 to communicate with the exhaust paths 5. The exhaust port 6 configures an exhauster.

Further, an exhaust chamber 7, which is formed in an annular shape, is provided along the circumferential direction on the peripheral edge of an upper surface of the lid 41, and the exhaust paths 5 are in communication with the exhaust chamber 7. A plurality of exhaust pipes 8 are connected to the exhaust chamber 7 along the circumferential direction, and a downstream end of each exhaust pipe 8 is connected, for example, to an exhaust duct (not illustrated) to which exhaust paths of respective sections within a factory are commonly connected.

The substrate processing apparatus 1 having the above configuration is controlled by a controller 100. The controller 100 is configured, for example, by a computer including a CPU, a memory, and others, and has a program storage (not illustrated). The program storage stores programs that control various processes in the substrate processing apparatus 1. For example, the opening/closing of the valves V1 to V4, the lifter 4 and 26, and the flow regulators 45 and 54 are controlled by the controller 100 based on the programs. In addition, the programs were recorded on a computer-readable storage medium H, but may be installed from the storage medium H to the controller 100. Further, the programs may be installed via a network. The storage medium M may be either transitory or non-transitory.

Next, a process of forming a friction reducing film on the rear surface of the wafer W using the substrate processing apparatus 1 with the above configuration will be described. First, the lid 41 is raised to open the processing container C, and the wafer W in which a semiconductor device is to be formed on the frontal surface side is transferred to a region above the heating plate 20 by a substrate transfer mechanism (not illustrated). The substrate is then delivered from the substrate transfer mechanism to the lifting pins 24. After the substrate transfer mechanism retreats out of the processing container C, the lid 41 is lowered to close the processing container C (as illustrated in FIG. 1).

The wafer W is supported on the lifting pins 24 with a set distance of, for example, 2 mm between the rear surface of the wafer W and the surface of the heating plate 20. At this time, the wafer W is supported on the lifting pins 24 such that the center of the wafer W is aligned with the center of the heating plate 20, i.e., the center of the second discharge hole 43a within a predetermined allowable range.

Further, a nitrogen gas as the purge gas is supplied from the purge gas source 46 into the processing container C by opening the valves V3 and V4. By doing so, the purge gas is supplied to the peripheral edge of the wafer W from the plurality of first discharge holes 51a provided in the ceiling portion 41a of the lid 41 facing the wafer W, and the purge gas is also supplied to a central portion of the wafer W from the second discharge hole 43a located closer to the center than the first discharge holes 51a. Meanwhile, the atmosphere in the processing space S is exhausted from the periphery of the wafer W through the exhaust port 6.

Figure 4:
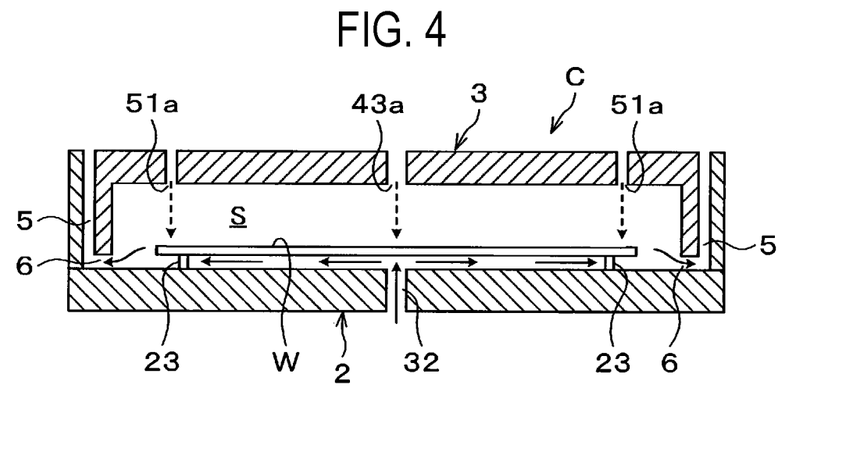
FIG. 4 is an explanatory view illustrating a state of a wafer being supported by gap pins and processed in the substrate processing apparatus of FIG. 1.

In this state, when the wafer W is supported on the gap pins 23 by lowering the lifting pins 24 as illustrated in FIG. 4, HMDS is deposited on the rear surface of the wafer W. Since the height of the gap pins 23 is set to 1 mm from the surface of the heating plate 20 as described above, there is a narrow space between the rear surface of the wafer W and the heating plate 20, which allows for the efficient deposition of HMDS on the rear surface of the wafer W.

However, the narrow space between the rear surface of the wafer W and the heating plate 20 may cause the HMDS vapor to infiltrate the frontal surface from the peripheral edge of the wafer W. However, in the present embodiment, since the plurality of first discharge holes 51a supplies the purge gas to the peripheral edge of the wafer W, and the second discharge hole 43a located closer to the center than the first discharge holes 51a supply the purge gas to the central portion of the wafer W, it is possible to prevent the infiltration of the HMDS vapor to the frontal surface.

That is, in the present embodiment, not only the first discharge holes 51a supply the purge gas to the peripheral edge of the wafer W, but also the second discharge hole 43a supplies the purge gas to the central portion of the wafer W, which may effectively prevent such infiltration. To explain in detail, even if the supply of the purge gas from the first discharge holes 51a prevents the infiltration from the peripheral edge of the wafer, a slight amount of infiltration to the frontal surface depending on the supply flow rate of the purge gas may still be possible. However, since the purge gas is also supplied to the central portion of the wafer W, it may create a purge gas flow from the center to the peripheral edge on the frontal surface of the wafer W, so that the HMDS vapor, trying to infiltrate the center side, may be pushed back to the peripheral edge by this purge gas flow.

Regarding the magnitudes of the supply flow rate from the first discharge holes 51a and the supply flow rate from the second discharge hole 43a at that time, for example, when the distance d between the plurality of first discharge holes is set to 3 mm as in the present embodiment, the supply flow rate from the second discharge hole 43a may be set to be lower than the supply flow rate from the first discharge holes 51a. The reason for this is as follows. That is, in a "dense" arrangement where the distance d between the first discharge holes 51a is equal to or less than 3 mm, the purge gas flow from the respective first discharge holes 51a forms a type of air curtain at the peripheral edge of the wafer W, which may strongly prevent the infiltration to the frontal surface. Therefore, even if the HMDS vapor tries to infiltrate the center of the wafer W from the peripheral edge, the amount of the HMDS vapor is extremely small.

On the other hand, in a "sparse" arrangement where the distance d between the first discharge holes 51a is greater than 3 mm, for example, 4 mm, it is considered that the amount of the HMDS vapor infiltrating the central portion of the frontal surface of the wafer W through the gap between the first discharge holes 51a will increase. A proper measurement for this can be possible by setting the supply flow rate from the second discharge hole 43a to be higher than the supply flow rate from the first discharge holes 51a.

In the present embodiment, the supply flow rate from the first discharge holes 51a and the supply flow rate from the second discharge hole 43a may be individually controlled through independent supply systems, respectively. Further, utilizing this, it is also possible to intentionally control the infiltration of the HMDS vapor from the peripheral edge to the center of the wafer W.

That is, by controlling the supply flow rate from the first discharge holes 51a and the supply flow rate from the second discharge hole 43a, for example, it is possible to actively cause the HMDS vapor to infiltrate the peripheral edge of the wafer W, thus realizing the deposition of HMDS within a desired range from the peripheral edge. This enables to form a friction reducing film suitable for the subsequent processing of the wafer W on the peripheral edge of the frontal surface of the wafer W.

Results of actual verification by the inventors using the substrate processing apparatus 1 according to the embodiment will be described. In this verification, based on the fact that a HMDS deposition area has hydrophobicity, water was supplied to the peripheral edge of a wafer to measure the water repellency width thereof at that time. This was taken as the HMDS deposition width. Further, the supply flow rate from the first discharge holes 51a was incrementally varied by 1 [L/min] within the range of 6 to 10 [L/min], and the supply flow rate from the second discharge hole 43a was also incrementally varied by 1 [L/min] within the range of 1 to 5 [L/min].

As a result, it could be observed that the deposition width was the largest when both the supply flow rate from the first discharge holes 51a and the supply flow rate from the second discharge hole 43a were at the smallest values, and the deposition width decreased correspondingly by increasing the supply flow rate from the first discharge holes 51a while keeping the supply flow rate from the second discharge hole 43a at the minimum. Further, it could also be observed that the deposition width also decreased correspondingly by increasing the supply flow rate from the second discharge hole 43a while keeping the supply flow rate from the first discharge holes 51a at the minimum. Further, subtle differences in the deposition width were observed by combinations of respective flow rates. In this regard, it could be observed that it is possible to adjust the radial length (deposition width) of the wafer W infiltrated by the HMDS from the peripheral edge of the wafer W by controlling the supply flow rate from the first discharge holes 51a and the supply flow rate from the second discharge hole 43a.

By utilizing this, the purpose of enhancing the overlay accuracy during exposure can be realized by forming the friction reducing film before exposure, and an appropriate processing of the substrate considering EBR can be realized in a resist film formation process by forming the friction reducing film with the control of the deposition width, e.g., before the coating of the resist liquid.

Figure 5:
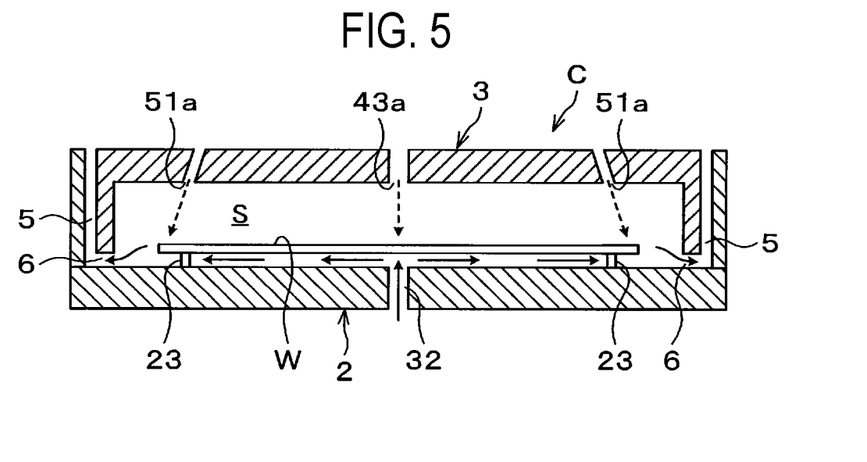
FIG. 5 is an explanatory view illustrating the processing of the wafer by the substrate processing apparatus in which the first discharge holes are formed obliquely.

In the above embodiment, all of the first discharge holes 51a are oriented to vertically discharge the purge gas to the peripheral edge of the wafer W. However, as illustrated in FIG. 5, it is also possible to obliquely form the flow path so that the purge gas from the first discharge holes 51a is discharged to the peripheral edge of the wafer W obliquely outward from the center.

Figure 6:
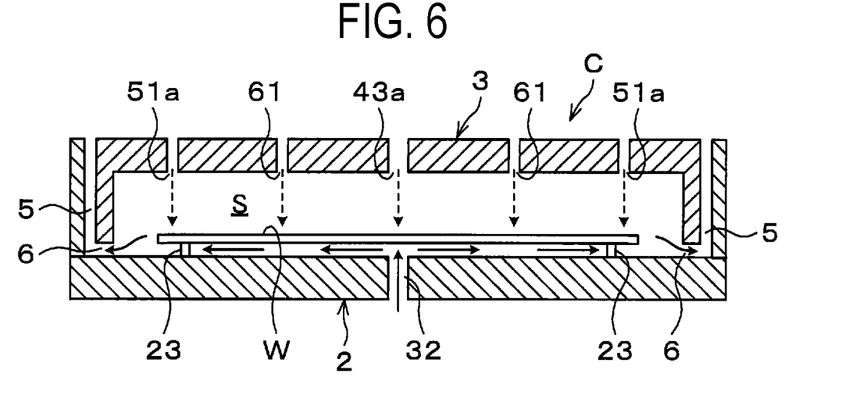
FIG. 6 is an explanatory view illustrating the processing of the wafer by the substrate processing apparatus having third discharge holes.

Furthermore, in the above embodiment, the second discharge hole 43a is provided closer to the center than the first discharge holes 51a which supply the purge gas to the peripheral edge of the wafer W. However, as illustrated in FIG. 6, it is also possible to provide third discharge holes 61 between the first discharge holes 51a and the second discharge hole 43a to supply the purge gas to the area between the peripheral edge and the center of the wafer W. In this case, the supply flow rate from the third discharge holes 61 may be set to be lower than the supply flow rates from the first discharge holes 51a and the second discharge hole 43a.

Figure 7:
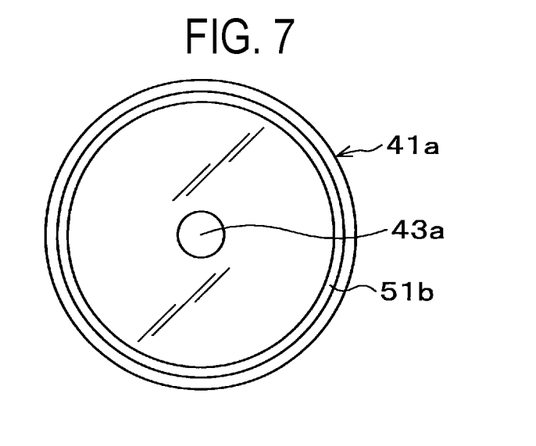
FIG. 7 is an explanatory view of the ceiling portion with the first discharge hole formed as a circular ring-shaped slit hole as viewed from the bottom side.

In the above-described embodiment, the first discharge holes 51a are configured as circular holes arranged in an annular shape. However, for the purpose of forming an air curtain to prevent the infiltration of the HMDS vapor to the frontal surface, for example, as illustrated in FIG. 7, it is also possible to use a circular ring-shaped first discharge hole 51b. This case can have a better function as an air curtain than the above described embodiment. Accordingly, the supply flow rate from the second discharge hole 43a may be set to be lower than the supply flow rate from the first discharge hole 51b.

Figure 8:
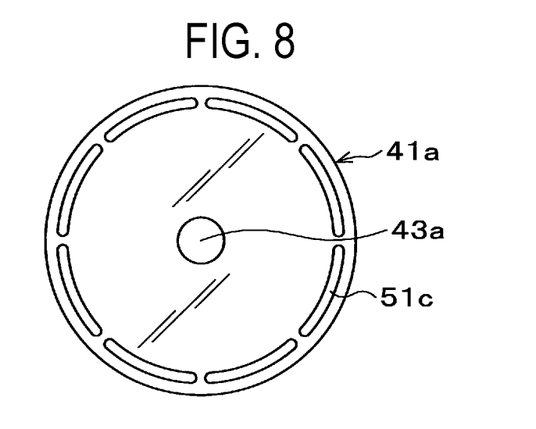
FIG. 8 is an explanatory view of the ceiling portion with the first discharge hole formed as arc-shaped slit holes as viewed from the bottom side.

Further, as illustrated in FIG. 8, it is also possible to use first discharge holes 51c formed as arc-shaped slits. Also in this case, a better function as an air curtain than the above described embodiment can be achieved by reducing the distance between the neighboring first discharge holes 51c. Thus, the supply flow rate from the second discharge hole 43a may be set to be lower than the supply flow rate from the first discharge holes 51c.

Figure 9:
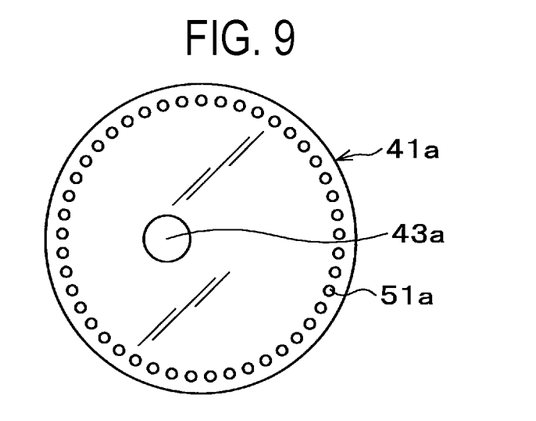
FIG. 9 is an explanatory view of the ceiling portion with a second discharge hole provided eccentrically from the center as viewed from the bottom side.

Furthermore, in all of the above examples, the second discharge hole 43a is provided at the center of the ceiling portion 41a facing the wafer W to supply the purge gas toward the center of the wafer W. However, as illustrated in FIG. 9, it is also possible to provide the second discharge hole 43a at an offset position from the center of the ceiling portion 41a to supply the purge gas to a position eccentric from the center of the wafer W. In this case as well, since the purge gas is supplied closer to the center than the first discharge hole 51a, the HMDS vapor, trying to infiltrate the center, may be pushed back to the peripheral edge.

For the purpose of supplying the purge gas closer to the center than the first discharge holes 51a, it is not necessary to limit the number of second discharge holes 43a to one, and two or more second discharge holes may be provided.

The embodiments disclosed herein should be considered to be exemplary and not limitative in all respects. The above embodiments may be omitted, replaced or modified in various embodiments without departing from the scope of the appended claims and their gist.

EXPLANATION OF REFERENCE NUMERALS

1: substrate processing apparatus, 2: lower member, 3: upper member, 5: exhaust path, 6: exhaust port, 20: heating plate, 22: heater, 41: lid, 41a: ceiling portion, 43a: second discharge hole, 44, 53: purge gas supply pipe, 45, 54: flow regulator, 46: purge gas source, 51a: first discharge hole, 100: controller, C: processing container, S: processing space, V1 to V4: valve, W: wafer

What is claimed is:

1. A substrate processing apparatus that forms a friction reducing film on a rear surface of a substrate, the apparatus comprising:
    a processing container configured to accommodate the substrate therein and to define a hermetically-sealed processing space;
    a heating element configured to heat the rear surface of the substrate inside the processing container;
    a supplier configured to supply a material that forms the friction reducing film toward the rear surface of the substrate inside the processing container;
    a first gas supplier configured to supply an inert gas to a peripheral edge of the substrate from a space above the substrate inside the processing container;
    a second gas supplier configured to supply the inert gas closer to a center of the substrate than the first gas supplier from a space above the substrate inside the processing; and
    an exhauster configured to exhaust an atmosphere of the processing space from a periphery of the substrate or a space below the substrate inside the processing container.

2. The substrate processing apparatus of claim 1, wherein the first gas supplier has a plurality of first discharge holes, and
    wherein the plurality of first discharge holes are provided in an inner ceiling portion of the processing container along a circumferential direction of the substrate.

3. The substrate processing apparatus of claim 2, wherein a distance between the plurality of first discharge holes of the first gas supplier is greater than 3 mm, and a supply flow rate from the second gas supplier is greater than a supply flow rate from the first gas supplier.

4. The substrate processing apparatus of claim 2, wherein a distance between the plurality of first discharge holes of the first gas supplier is equal to or less than 3 mm, and a supply flow rate from the second gas supplier is less than a supply flow rate from the first gas supplier.

5. The substrate processing apparatus of claim 4, wherein the second gas supplier has one second discharge hole or two or more second discharge holes formed in the inner ceiling portion of the processing container and directed toward a central portion of the substrate.

6. The substrate processing apparatus of claim 5, wherein the supply flow rate from the first gas supplier and the supply flow rate from the second gas supplier are individually controlled.

7. The substrate processing apparatus of claim 6, wherein no other gas supplier is provided between the first gas supplier and the second gas supplier.

8. The substrate processing apparatus of claim 7, wherein the inert gas supplied from the first gas supplier is discharged to the peripheral edge of the substrate obliquely outward from the center of the substrate.

9. The substrate processing apparatus of claim 1, wherein the first gas supplier has one slit hole or two or more slit holes, and
wherein the one slit hole or the two or more slit holes are provided in an inner ceiling portion of the processing container along a circumferential direction of the substrate.

10. The substrate processing apparatus of claim 9, wherein a supply flow rate from the second gas supplier is less than a supply flow rate from the first gas supplier.

11. The substrate processing apparatus of claim 1, wherein the second gas supplier has one second discharge hole or two or more second discharge holes formed in an inner ceiling portion of the processing container and directed toward a central portion of the substrate.

12. The substrate processing apparatus of claim 1, wherein the supply flow rate from the first gas supplier and the supply flow rate from the second gas supplier are individually controlled.

13. The substrate processing apparatus of claim 1, wherein no other gas supplier is provided between the first gas supplier and the second gas supplier.

14. The substrate processing apparatus of claim 1, wherein a third gas supplier is provided between the first gas supplier and the second gas supplier to supply the inert gas to the substrate.

15. The substrate processing apparatus of claim 14, wherein a supply flow rate from the third gas supplier is less than the supply flow rates from the first gas supplier and the second gas supplier.

16. The substrate processing apparatus of claim 1, wherein the inert gas supplied from the first gas supplier is discharged to the peripheral edge of the substrate obliquely outward from the center of the substrate.

17. A substrate processing method of forming a friction reducing film on a rear surface of a substrate inside a processing container, the method comprising:
supplying a material that forms the friction reducing film toward the rear surface of the substrate while heating the rear surface of the substrate inside the processing container, and exhausting an inside of the processing container from a periphery of the substrate;
supplying an inert gas toward both a peripheral edge and a central portion of the substrate from a space above the substrate; and
independently controlling the inert gas supplied toward the peripheral edge and the central portion.

* * * * *